(12) United States Patent
Eberler et al.

(10) Patent No.: US 10,930,428 B2
(45) Date of Patent: Feb. 23, 2021

(54) FLAT ADJUSTABLE CAPACITOR FOR MAGNETIC RESONANCE SCANNER

(71) Applicant: Siemens Healthcare GmbH, Erlangen (DE)

(72) Inventors: Ludwig Eberler, Neumarkt i.d.OPf (DE); Razvan Lazar, Erlangen (DE); Volker Matschl, Bamberg (DE); Jürgen Nistler, Erlangen (DE); Martin Schramm, Eckental (DE)

(73) Assignee: Siemens Healthcare GmbH, Erlangen (DE)

( * ) Notice: Subject to any disclaimer, the term of this patent is extended or adjusted under 35 U.S.C. 154(b) by 140 days.

(21) Appl. No.: 16/027,685

(22) Filed: Jul. 5, 2018

(65) Prior Publication Data
US 2019/0019620 A1 Jan. 17, 2019

(30) Foreign Application Priority Data

Jul. 12, 2017 (DE) .......................... 102017211936.5

(51) Int. Cl.
| H01G 5/00 | (2006.01) |
| H01G 5/16 | (2006.01) |
| H01G 5/14 | (2006.01) |
| G01R 33/34 | (2006.01) |
| H01F 27/42 | (2006.01) |

(Continued)

(52) U.S. Cl.
CPC ....... *H01F 27/42* (2013.01); *G01R 33/34007* (2013.01); *G01R 33/34084* (2013.01); *G01R 33/3628* (2013.01); *H01G 5/0136* (2013.01); *H01G 5/0138* (2013.01); *H01G 5/16* (2013.01); *H01G 5/40* (2013.01); *G01R 33/34076* (2013.01)

(58) Field of Classification Search
CPC .......... G01R 33/3628; G01R 33/34007; G01R 33/34076; G01R 33/34084; H01G 5/0136; H01G 5/0138; H01G 4/28
See application file for complete search history.

(56) References Cited

U.S. PATENT DOCUMENTS 2,753,530 A * 7/1956 Horvath ............... H03H 7/0161
333/202
3,700,983 A * 10/1972 Goetzl ................. H01G 5/0138
361/279

(Continued)

FOREIGN PATENT DOCUMENTS

| DE | 102005046039 A1 | 4/2007 |
| DE | 102009043901 A1 | 5/2010 |
| DE | 102013215918 B4 | 7/2017 |

*Primary Examiner* — Alesa Allgood
(74) *Attorney, Agent, or Firm* — Lempia Summerfield Katz LLC

(57) ABSTRACT

The disclosure relates to a compensation capacitor for an antenna of a magnetic resonance scanner and a corresponding antenna with a compensation capacitor. The compensation capacitor has a first electrode and a second electrode arranged in parallel. An insulation material configured to resist high voltages and a dielectric with low dielectric losses are arranged between the first and the second electrode. The second electrode and/or the dielectric may be moved relative to the first electrode such that a surface area of a projection of the surface of the first electrode along the surface normal of the first electrode to the surface of the second electrode and/or the dielectric is variable.

15 Claims, 3 Drawing Sheets

(51) Int. Cl.
*H01G 5/013* (2006.01)
*H01G 5/40* (2006.01)
*G01R 33/36* (2006.01)

(56) References Cited

U.S. PATENT DOCUMENTS

| | | | | |
|---|---|---|---|---|
| 3,938,012 A | * | 2/1976 | Patti | H01G 5/12 |
| | | | | 361/295 |
| 4,375,626 A | * | 3/1983 | Hudak | H01G 5/0138 |
| | | | | 334/79 |
| 5,768,089 A | * | 6/1998 | Finnigan | G01R 33/3628 |
| | | | | 361/277 |
| 6,914,766 B2 | * | 7/2005 | Gonella | H01G 5/0136 |
| | | | | 361/294 |
| 7,394,642 B2 | * | 7/2008 | Grossniklaus | G01R 33/3628 |
| | | | | 361/292 |
| 8,680,863 B1 | * | 3/2014 | Qian | G01R 33/3635 |
| | | | | 324/307 |
| 9,048,023 B2 | * | 6/2015 | Liang | H01G 5/013 |
| 9,564,273 B2 | * | 2/2017 | Liang | H01G 5/013 |
| 2003/0137300 A1 | * | 7/2003 | Gonella | H01G 5/0136 |
| | | | | 324/322 |
| 2007/0070578 A1 | * | 3/2007 | Grossniklaus | G01R 33/3628 |
| | | | | 361/321.6 |
| 2013/0300418 A1 | * | 11/2013 | Eberler | G01R 33/34046 |
| | | | | 324/322 |
| 2014/0285285 A1 | * | 9/2014 | Liang | H03H 7/0115 |
| | | | | 333/174 |
| 2015/0042339 A1 | | 2/2015 | Lazar | |
| 2015/0224304 A1 | * | 8/2015 | Gray | A61N 1/37 |
| | | | | 607/62 |
| 2015/0262756 A1 | * | 9/2015 | Liang | H01G 5/013 |
| | | | | 361/289 |
| 2017/0104466 A1 | * | 4/2017 | Liang | H03H 7/0115 |

* cited by examiner

FLAT ADJUSTABLE CAPACITOR FOR MAGNETIC RESONANCE SCANNER

The application claims the benefit of German Patent Application No. DE 10 2017 211 936.5, filed Jul. 12, 2017, which is hereby incorporated by reference in its entirety.

TECHNICAL FIELD

The disclosure relates to a compensation capacitor for an antenna of a magnetic resonance scanner, in particular, a body coil. The compensation capacitor has a first electrode and a second electrode arranged in parallel thereto. An insulation material configured to resist high voltages and a dielectric with low dielectric losses are arranged between the first electrode and the second electrode.

BACKGROUND

Magnetic resonance scanners are imaging devices which align nuclear spins of the examination object with a strong external magnetic field to image an examination object and excite them by an alternating magnetic field for precession around this alignment. The precession and/or the return of the spins from this excited state to a state with lower energy in turn generates an alternating magnetic field which is received via antennae in response.

With the aid of magnetic gradient fields, spatial encoding is imprinted in the signals which subsequently enables an assignment of the received signal to a volume element. The received signal is then evaluated, and a three-dimensional imaging representation of the examination object provided. Local antennae, so-called local coils, which are arranged directly on the examination object to obtain a better signal-to-noise ratio, may be used to receive the signal.

Excitation takes place by way of an alternating magnetic field, which is generated by an amplifier and radiated into the examination area by an antenna. Outputs of a plurality of kilowatts are customary. The effectiveness of the excitation also depends on the precise tuning of the antenna, but this may be altered due to manufacturing tolerances, thermal expansion, or objects in the vicinity of the antenna. For compensation purposes, it is necessary to adjust the antenna to the individual surroundings by variable impedances as tuning elements. The high output of the excitation pulses leads to extreme demands on the voltage and current resistance of the tuning elements. At the same time, the quality of the antenna is not excessively reduced by ohmic or dielectric losses. Furthermore, due to the limited space in a patient passage of a superconducting field magnet, also referred to as a "bore," the space is limited.

Hitherto, for example, compensation capacitors from Voltronics, which are cylindrical in shape with a diameter of 10 to 15 mm, have been known for tuning.

Capacitors for an antenna which offset thermal effects on the tuning of the antenna by their temperature coefficients are known from German Patent Publication No. DE 10 2013 215 918.

SUMMARY AND DESCRIPTION

The scope of the present disclosure is defined solely by the appended claims and is not affected to any degree by the statements within this description. The present embodiments may obviate one or more of the drawbacks or limitations in the related art.

The object of the present disclosure could therefore be to provide an antenna with an improved opportunity for tuning.

The object is achieved by the compensation capacitor and an antenna as described herein.

The compensation capacitor for an antenna of a magnetic resonance scanner, in particular, a body coil, has a first electrode and a second electrode. The first electrode and the second electrode are essentially arranged in parallel. "Essentially in parallel" or "arranged in parallel" is understood to mean that the respective electrode may be moved in parallel to its surface relative to the other electrode, at least along one axis, without the electrodes coming into contact with each other or being located below a minimum insulation distance. The electrode may be flat and/or two-dimensional, e.g., the dimension in one direction of the thickness along the surface normal of the surface is small compared with the dimensions along the surface. The surfaces of the first electrode and the second electrode are straight and not curved, at least along one direction and/or one axis such that the first electrode may be moved along this axis relative to the second electrode without changing the distance. The first electrode and the second electrode may be subareas of plane-parallel planes. In principle, however, concentric cylinder surfaces or other surface shapes would be conceivable, for example, which are spanned by displacement of a curve in a plane along the surface normal to this plane out of said plane. Viewed mathematically, these surfaces are parts of lateral surfaces of prisms.

An insulation material configured to resist high voltages and a dielectric with low dielectric losses are arranged between the first electrode and the second electrode. It is also conceivable that given a suitable choice of material, the insulation material and the dielectric is also a single piece of material, for example, a film or a block. A flat piece of Teflon, for example, would be possible.

The second electrode and/or the dielectric may be moved relative to the first electrode such that a surface area of a projection of the surface of the first electrode along the surface normal of the first electrode to the surface of the second electrode and/or the dielectric is variable. It is conceivable, for example, that the first and the second electrode are aligned plane-parallel to a plane and may be moved parallel to this plane along an axis. However, electrodes in the form of lateral surfaces of a prism, as described above, are another possibility.

Advantageously, the movement of the second electrode and/or the dielectric by changing the overlapping surfaces of the opposing first electrode and the second electrode or even the surface area with the dielectric between them causes a change in the capacitance. At the same time, the thickness of the compensation capacitor is slight as a result of the flat structure and the movement in the area and permits a shallower depth in the restricted interior of the patient passage.

The antenna shares the benefits of the compensation capacitor disclosed herein.

In a conceivable embodiment of the compensation capacitor, the compensation capacitor has a third electrode. The third electrode and the second electrode are essentially arranged in parallel. Here, what has already been said about the parallelism of the first and the second electrode applies analogously.

An insulation material configured to resist high voltages and a dielectric with low dielectric losses are likewise arranged between the third electrode and the second electrode. Here too, what was already said before applies. It is conceivable that the insulation material and/or the dielectric is designed in one piece with the insulation material and/or the dielectric between the first electrode and the second electrode. The second electrode and/or the dielectric may be moved relative to the third electrode such that a surface area of a projection of the surface of the third electrode along the surface normal of the third electrode to the surface of the second electrode and/or the dielectric is variable, wherein the first electrode and the third electrode are electrically insulated from each other. In this case, for example, it is conceivable that the first electrode and the second electrode forms a first capacitor and the second electrode with the third electrode, a second capacitor. The first capacitor and the second capacitor are connected in series via the conductor of the second electrode.

The introduction of the third electrode advantageously enables the mechanical movement in the compensation capacitor to be separated from the electrical terminals and thus increase the reliability and quality.

In a possible embodiment of the compensation capacitor, the first electrode and the third electrode have terminals for an electrical connection with the antenna.

In that the second electrode may be moved relative to the first electrode and the second electrode, the electrical connection to the non-moving first electrode and third electrode may be undertaken advantageously. The electrical connection may therefore be designed rigidly with low-loss materials such as, for example, broad conductor surfaces, which are soldered, welded, or clamped. It is also conceivable that the first electrode and the third electrode are designed in one piece with adjacent structures of the antenna.

In a conceivable embodiment of the compensation capacitor, the first electrode and the third electrode are arranged side by side opposite a first surface of the second electrode. In other words, the first and the third electrode are arranged on the same side of the second electrode. The projections of the first electrode and the third electrode on the first surface of the second electrode form a non-empty intersection along the surface normal of the first surface, e.g., at least subareas of the first electrode and of the third electrode face the second partial electrode in the form of a plate capacitor and form a capacitor which may be varied by a relative movement of the second electrode.

Advantageously, the first electrode and the third electrode with the second electrode form two capacitors connected in series which are variable by way of the relative movement of the second electrode. The arrangement of the first electrode and the third electrode side by side enables a flat design, in particular, the terminals of such a compensation capacitor are arranged in a plane.

In a possible embodiment of the compensation capacitor, the first electrode and/or the third electrode surrounds the second electrode partially on a plurality of sides. The first electrode and/or the third electrode surround the second electrode from three sides respectively, for example, in the shape of a U. In this case, the second electrode may be surrounded in a U-shape by the first electrode and the third electrode respectively such that the second electrode is surrounded by the first electrode and the third electrode, except for a gap at which the first electrode and the third electrode are separated by an insulation material or a voltage-safe distance. The second electrode may only be moved parallel to the U-shaped first electrode and third electrode such that the second electrode leaves the space surrounded by the first and the third electrode and thus reduces the capacitance between the first and the third electrode.

Advantageously, the shape(s) of the first electrode and/or the third electrode which surrounds and/or surround the second electrode on a plurality of sides makes it possible to enlarge the capacitance of the compensation capacitor without substantially increasing the space requirement and at the same time to provide a mechanical guide for a relative movement of the second electrode.

In another conceivable embodiment of the compensation capacitor, the first electrode and the third electrode are arranged opposite opposing first and second surfaces of the second electrode. In particular, the first and the second surface are not narrow sides of the second electrode, but may be the surfaces of the second electrode with the greatest surface area. For example, the first surface and the second surface may be the top and the bottom of a two-dimensional conductor such as a straight or curved metal sheet. In other words, the first electrode, the second electrode, and the third electrode, each separated by an intervening insulator and/or dielectric, form a stack.

Advantageously, the stacked arrangement offers a particularly compact design in a lateral direction.

In a possible embodiment of the compensation capacitor, the compensation capacitor has an adjustment device which is designed to arrange the second electrode and/or the dielectric in a variable predetermined relative position to the first electrode.

As a result of the altered predetermined position of the electrode and or of the dielectric, the capacitance of the compensation capacitor may be advantageously adjusted to predetermined values.

In a conceivable embodiment of the compensation capacitor, the adjustment device is designed to move the second electrode along a geometric axis essentially parallel to the first surface. For example, a spindle or a screw may move the electrode and/or the dielectric along the geometric axis. An axis in the sense of a linear guide is therefore unnecessary.

A movement along a geometric axis parallel to the expansion of the electrodes advantageously permits a particularly compact and flat design of the compensation capacitor.

In a possible embodiment of the compensation capacitor, the compensation capacitor has a clamping device which is designed to press the first electrode, the second electrode, the insulation material, and the dielectric against each other. The compensation capacitor may have guide elements such as pins, for example, which secure the first electrode and if necessary, the third electrode against a movement transversely to the direction of force of the clamping device.

Advantageously, a clamping device makes it possible to keep the distances of the electrodes constant even with a relative movement of the second electrode and/or of the dielectric and at the same time to limit the force for relative movement during tuning by a constant predetermined clamping force.

BRIEF DESCRIPTION OF THE DRAWINGS

The aforementioned properties, features, and advantages of the disclosure and the manner in which they are achieved become clearer and more readily understandable in connection with the following description of the exemplary embodiments which are explained in more detail with reference to the figures.

DETAILED DESCRIPTION

Figure 1:
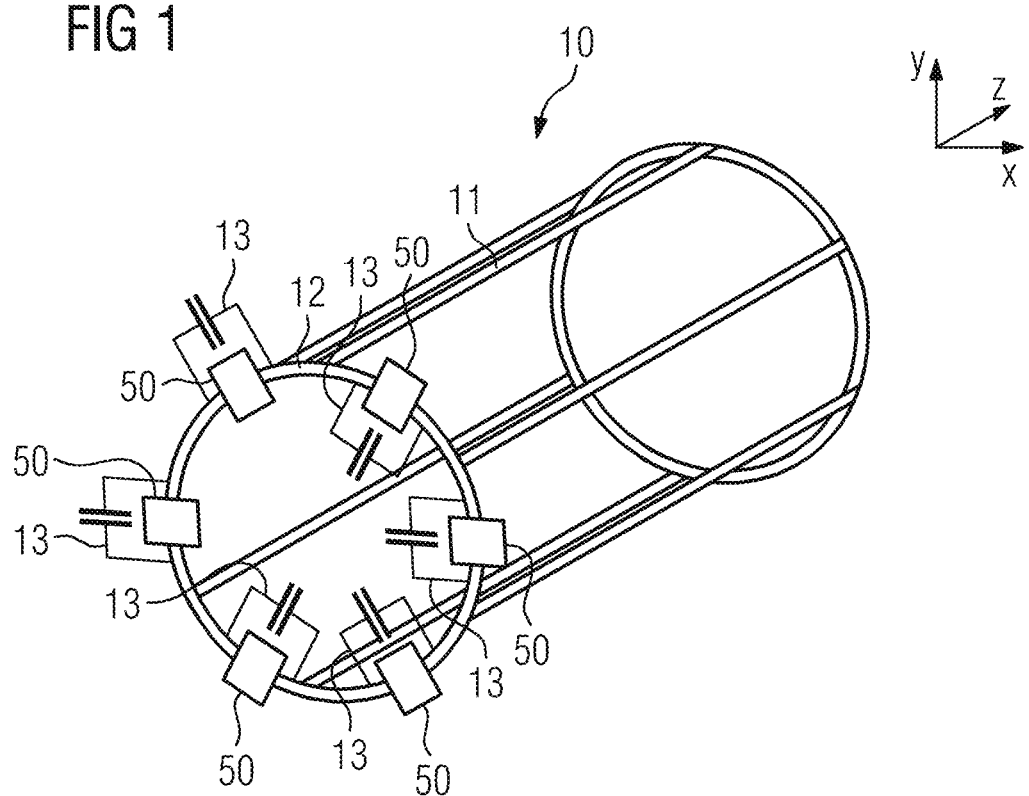
FIG. 1 depicts a diagrammatic view of an embodiment of an antenna with a compensation capacitor.

FIG. 1 depicts an exemplary embodiment of an antenna 10. In this case, it is a so-called birdcage antenna, which is frequently arranged as a body coil in a patient passage of a magnetic resonance scanner. The antenna 10 includes conductor elements 11 arranged on the walls of the patient passage in the z-direction parallel to the magnetic field B0 of the field magnet. The rods are connected at the ends by conductive rings 12, wherein to generate a phase shift and thus a circular B1 field, the rings 12 are interrupted and the interruption is bridged, for example, with capacitances 13. As the capacitances 13 as well as the assembly in the patient passage have manufacturing tolerances, it is necessary to also provide compensation capacitors 50 for the comparison of capacitors 13 and thus the antenna 10 in the interruptions of the rings.

Figure 2:
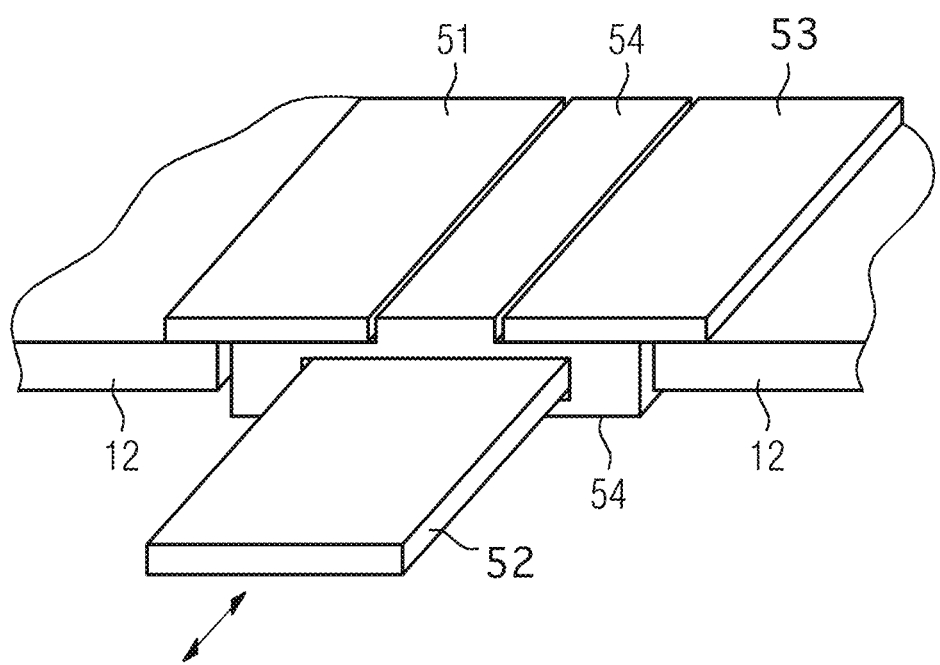
FIG. 2 depicts a diagrammatic view of an embodiment of a compensation capacitor.

FIG. 2 depicts an embodiment of a compensation capacitor 50 with embedding in an antenna 50. For the sake of clarity, the fixed capacitances 13 are not shown.

Figure 3:
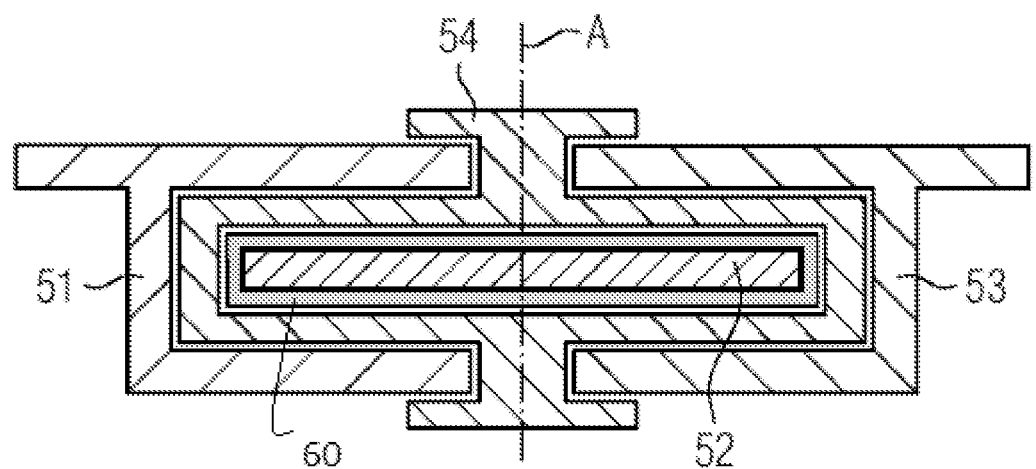
FIG. 3 depicts a diagrammatic cross-section through an embodiment of the compensation capacitor.

FIG. 3 depicts a cross-section of an embodiment of the compensation capacitor. Identical reference characters denote identical objects.

In FIGS. 2 and 3, a first electrode 51 and a third electrode 53 are arranged in the interruption between the segments of the ring 12, wherein each electrode is electrically connected to another ring segment 12. The connection may be extensive and have low inductance and resistance to improve the quality of the antenna 10. It is even conceivable that the first electrode 51 and/or the third electrode 53 are designed in one piece with the ring segments 12. The first electrode 51 and the third electrode 53 are separated by an insulator 54 and/or an air gap to avoid a flashover with the high outputs applied to the antenna 10.

In FIGS. 2 and 3, the second electrode 52 is arranged below, separated from the first electrode 51 and the third electrode 53 by the insulator 54. The insulator 54 serves simultaneously as a low-loss dielectric. However, it is also conceivable, for example, that a high-voltage resistant insulator 54 and a dielectric 60 are designed as stacked layers in different materials (as depicted in FIG. 3). The insulator 54 may be designed as a pocket into which the second electrode 52 may be moved in the direction indicated parallel to the first electrode 51 and the third electrode 53. However, an additional holding structure or guide which permits a movement of the second electrode 52 parallel to the first electrode 51 and the third electrode 53 is also conceivable. In this way, the size of the surfaces with which the first electrode 51 and the third electrode 53 respectively overlap with the second electrode 52 may be determined and the capacitance of the compensation capacitor 50 thus adjusted. The total capacitance results from a series connection of the two capacitances formed by the first electrode 51 with the second electrode 52, and the second electrode 52 and the third electrode 53.

The embodiment of FIG. 3 is distinguished from the embodiment of FIG. 2 in that the first electrode 51 and the third electrode 53 are not plates but two plates connected by a bridge which together form a U open to the side in each case. The two U-shaped electrodes face each other with the opening of the U and thereby form an almost closed interior which is open only at a separation gap required for the insulation of the first electrode 51 from the third electrode 53. In the interior is the insulator 54, which as already in FIG. 2 forms a pocket for the second electrode 52. The U-shape of the first electrode 51 and the third electrode 53 doubles the area opposite the second electrode 52 and, with the same dimensions, permits double the capacitance of the compensation capacitor 50 and/or vice versa a reduction with the same capacitance. An effect of the play of the second electrode 52 towards or away from the other electrodes (in the direction of the surface normal) has a much smaller effect on the capacitance as due to the symmetry, the magnification on the one side is compensated by a reduction on the opposite side. Furthermore, the compensation capacitor is particularly robust mechanically.

Figure 4:
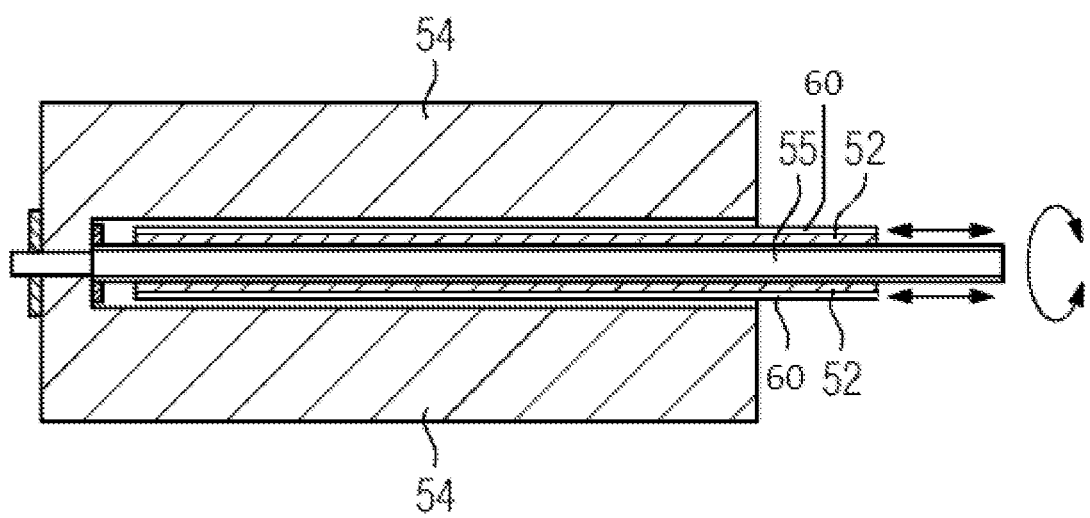
FIG. 4 depicts a diagrammatic longitudinal section through an embodiment of the compensation capacitor with an adjustment device.

FIG. 4 depicts a diagrammatic longitudinal section through another embodiment of the compensation capacitor of FIG. 3 along the line A with an adjustment device. Here, the adjustment device 55 is designed as a spindle which engages in a thread of a bore through the second electrode 52. The spindle is rotatably anchored in the insulator 54, for example, by two snap rings, splints, or lock nuts. In this manner, by a rotation of the spindle about its own axis, a force may be exerted on the second electrode 52 so that the latter is moved along the spindle in the pocket and the opposing surfaces of the first electrode 51 to the second electrode 52 and the third electrode 53 to the second electrode 52 are changed and thus the capacitance of the compensation capacitor 50. However, other mechanical drives are also conceivable for the second electrode 52, (such as a rack), but pneumatic drives or hydraulic drives would also be possible at inaccessible locations, as a result of which the electrode may be displaced like a double-stroke piston.

Figure 5:
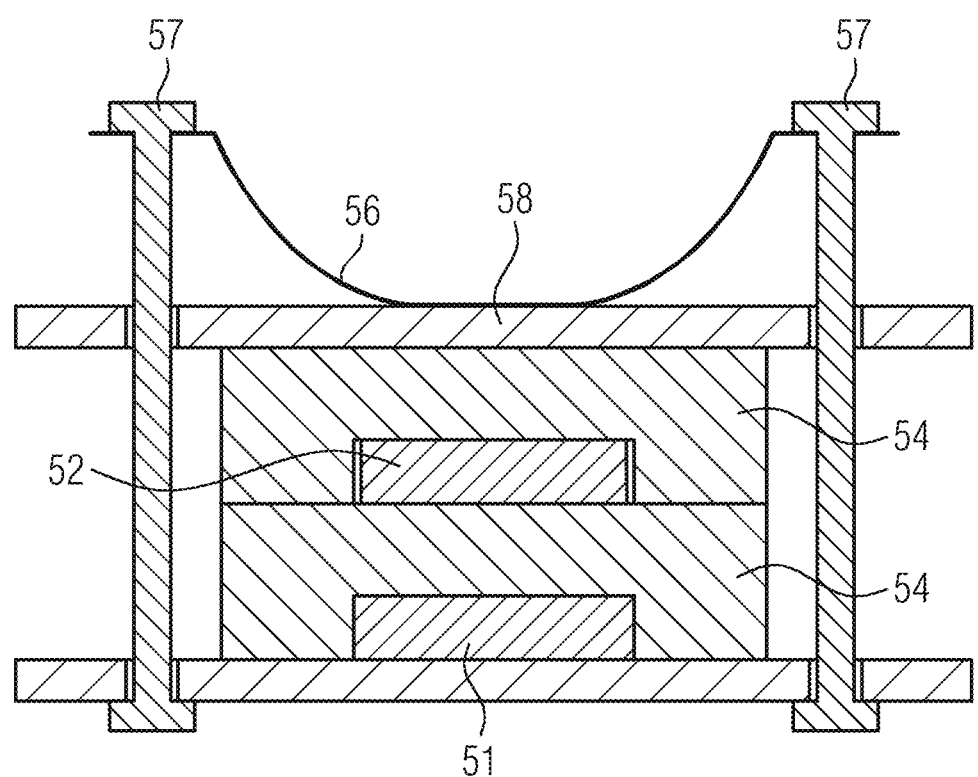
FIG. 5 depicts a diagrammatic cross-section through an embodiment of the compensation capacitor with a clamping device.

FIG. 5 depicts a diagrammatic cross-section perpendicular to the direction of movement of the second electrode 52 through a possible embodiment of the compensation capacitor. In this embodiment, the compensation capacitor has guide elements 57 arranged in the form of pins on both sides of the first electrode 51 and the second electrode 52. In FIG. 5, a leaf spring is provided as a clamping device 56 which is clamped against a stop of the pins and presses the substrate 58 against the insulator 54 and the second electrode 52, thus providing a constant and minimum distance between the second electrode 52 and the first electrode 51. However, other elastic elements such as, for example, spiral springs are also conceivable.

A third electrode 53 is not provided in the embodiment of FIG. 5, but the second electrode 52 itself is provided with a flexible connection for an electrical connection, (e.g., with the ring segment). However, it would also be possible to configure the second electrode in a non-movable manner, but to movably arrange a separate dielectric in the stack between the first electrode 51 and the second electrode 52 and to be able to pull this out of the stack in order to change the capacitance of the compensation capacitor, as has already been illustrated by way of example for the second electrode in FIG. 4.

It is also conceivable, however, to arrange the clamping device 56 on the embodiments of FIG. 2 or FIG. 3, for example.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A compensation capacitor for an antenna of a magnetic resonance scanner, the compensation capacitor comprising:
   a first electrode;
   a second electrode, wherein the first electrode and the second electrode are arranged in parallel;
   an insulator configured to resist high voltages arranged between the first electrode and the second electrode; and
   a dielectric with low dielectric losses arranged between the insulator and the second electrode,
   wherein one or both of the second electrode and the dielectric are configured to move relative to the first electrode such that a surface area of a projection of a surface of the first electrode along a surface normal of the first electrode to one or both of a surface of the second electrode and a surface of the dielectric is variable.

2. The compensation capacitor of claim 1, wherein the antenna is a body coil.

3. The compensation capacitor of claim 1, further comprising:
   a clamping device configured to press the first electrode, the second electrode, the insulator, and the dielectric against each other.

4. The compensation capacitor of claim 1, further comprising:
   an adjustment device configured to arrange one or both of the second electrode and the dielectric in a variable predetermined relative position to the first electrode.

5. The compensation capacitor of claim 4, wherein the adjustment device is configured to move the second electrode along an axis parallel to the surface of the second electrode.

6. The compensation capacitor of claim 4, further comprising:
   a clamping device configured to press the first electrode, the second electrode, the insulator, and the dielectric against each other.

7. A compensation capacitor for an antenna of a magnetic resonance scanner, the compensation capacitor comprising:
   a first electrode;
   a second electrode, wherein the first electrode and the second electrode are arranged in parallel;
   a third electrode, wherein the third electrode and the second electrode are arranged in parallel, and wherein the first electrode and the third electrode are arranged side by side opposite a first surface of the second electrode; and
   an insulator configured to resist high voltages, wherein the insulator is arranged between the first electrode and the second electrode, between the second electrode and the third electrode, and between the first electrode and the third electrode,
   wherein the second electrode is configured to move relative to the first electrode such that a surface area of a projection of a surface of the first electrode along a surface normal of the first electrode to the first surface of the second electrode is variable, and
   wherein the second electrode is configured to move relative to the third electrode such that a surface area of a projection of a surface of the third electrode along a surface normal of the third electrode to the first surface of the second electrode is variable.

8. The compensation capacitor of claim 7, wherein the first electrode and the third electrode have terminals for an electrical connection with the antenna.

9. The compensation capacitor of claim 7, wherein one or both of the first electrode and the third electrode partially surround the second electrode on a plurality of sides.

10. The compensation capacitor of claim 7, wherein the first electrode and the third electrode are arranged side by side opposite a second surface of the second electrode, wherein the second surface of the second electrode is opposite the first surface of the second electrode, such that the second electrode is partially surrounded by a U-shape of the first electrode and a U-shape of the third electrode.

11. The compensation capacitor of claim 7, further comprising:
    a clamping device configured to press the first electrode, the second electrode, and the insulator against each other.

12. The compensation capacitor of claim 7, further comprising:
    an adjustment device configured to arrange the second electrode in a variable predetermined relative position to the first electrode and the third electrode.

13. The compensation capacitor of claim 12, wherein the adjustment device is configured to move the second electrode along an axis parallel to the first surface of the second electrode.

14. The compensation capacitor of claim 12, further comprising:
    a clamping device configured to press the first electrode, the second electrode, and the insulator against each other.

15. An antenna for a magnetic resonance scanner, the antenna comprising:
    a compensation capacitor having:
      a first electrode;
      a second electrode, wherein the first electrode and the second electrode are arranged in parallel; and
      an insulator configured to resist high voltages arranged between the first electrode and the second electrode; and
      a dielectric with low dielectric losses arranged between the insulator and the second electrode,
      wherein one or both of the second electrode and the dielectric are configured to move relative to the first electrode such that a surface area of a projection of a surface of the first electrode along a surface normal of the first electrode to one or both of a surface of the second electrode and a surface of the dielectric is variable.

* * * * *